(12) United States Patent
Sun et al.

(10) Patent No.: US 8,837,539 B1
(45) Date of Patent: Sep. 16, 2014

(54) OPTICAL POWER STABILIZING DEVICE

(71) Applicant: National Chi Nan University, Nantou (TW)

(72) Inventors: Tai-Ping Sun, Jhongli (TW); Hsiu-Li Shieh, Taichung (TW); Kun-Shuan Huang, Nantou (TW); Ming-Chiao Shieh, Taichung (TW)

(73) Assignee: National Chi Nan University, Puli, Nantou (TW)

( * ) Notice: Subject to any disclaimer, the term of this patent is extended or adjusted under 35 U.S.C. 154(b) by 0 days.

(21) Appl. No.: 14/087,772

(22) Filed: Nov. 22, 2013

(30) Foreign Application Priority Data

Jul. 24, 2013 (TW) .............................. 102126491 A

(51) Int. Cl.
*H01S 3/13* (2006.01)
*H01S 5/068* (2006.01)

(52) U.S. Cl.
CPC .................................. *H01S 5/06808* (2013.01)
USPC .............. 372/29.021; 372/29.02; 372/29.011; 372/29.01; 372/38.07; 372/38.02; 372/38.01

(58) Field of Classification Search
USPC ................. 372/29.021, 29.02, 29.011, 29.01, 372/38.07, 38.02, 38.01
See application file for complete search history.

(56) References Cited

U.S. PATENT DOCUMENTS

| | | | |
|---|---|---|---|
| 6,310,901 B1 * | 10/2001 | Mahmoudi et al. | 372/38.02 |
| 2007/0091946 A1 * | 4/2007 | Marshall | 372/38.07 |
| 2011/0062889 A1 * | 3/2011 | Hoogzaad et al. | 315/294 |
| 2011/0211605 A1 * | 9/2011 | Wang et al. | 372/38.01 |
| 2012/0206064 A1 * | 8/2012 | Archenhold | 315/297 |

* cited by examiner

*Primary Examiner* — Kinam Park
(74) *Attorney, Agent, or Firm* — Merchant & Gould P.C.

(57) ABSTRACT

An optical power stabilizing device is adapted to stabilize optical power of a light emitting device having a forward voltage, and includes a current generating circuit that generates a pulse-wave driving current to drive light emission of the light emitting device, an optical-type feedback circuit that outputs a first feedback voltage according to detected optical power of the light emitting device, an electrical-type feedback circuit that outputs a second feedback voltage according to the forward voltage, and a pulse wave generating circuit that generates a pulse-wave signal to control the current generating circuit according to one of the first feedback voltage and the second feedback voltage.

8 Claims, 11 Drawing Sheets

US 8,837,539 B1

OPTICAL POWER STABILIZING DEVICE

CROSS-REFERENCE TO RELATED APPLICATION

This application claims priority to Taiwanese Application No. 102126491, filed on Jul. 24, 2013.

BACKGROUND OF THE INVENTION

1. Field of the Invention

The invention relates to a power control device, and more particularly to an optical power stabilizing device.

2. Description of the Related Art

FIG. 1 shows a conventional optical power control device adapted to receive a direct-current input voltage Vin and generate a working current I to drive a laser diode 11. When the input voltage Vin is constant, the working current I has a constant magnitude.

However, the working current I resulting from the direct-current input voltage Vin will increase temperature of the laser diode 11, and characteristics of the laser diode 11 may thus vary.

Referring to FIGS. 1, 2 and 3, the laser diode 11 has a forward voltage varying with ambient temperature. When the laser diode 11 is driven with a constant current, rise in the ambient temperature may result in drop of the forward voltage (see FIG. 2), so that optical power of the laser diode 11, which is proportional to a product of the forward voltage and the working current, drops with rise in the ambient temperature, as best shown in FIG. 3.

SUMMARY OF THE INVENTION

Therefore, an object of the present invention is to provide an optical power stabilizing device for a light emitting device.

According to the present invention, an optical power stabilizing device is adapted to stabilize optical power of a light emitting device that has a forward voltage. The forward voltage has an inverse relationship with an ambient temperature when driven with current. The optical power stabilizing device comprises:

a current generating circuit to be coupled to the light emitting device and disposed to receive a pulse-wave signal, the current generating circuit being configured to convert the pulse-wave signal into a driving current to be provided to the light emitting device, the driving current being a pulse wave in magnitude and having an average magnitude proportional to a duty cycle of the pulse-wave signal;

an optical-type feedback circuit including a photodetector that is disposed to receive light emitted by the light emitting device, and that is configured to generate a photocurrent associated with optical power of the light emitting device, the optical-type feedback circuit being configured to generate a first feedback voltage according to the photocurrent;

an electrical-type feedback circuit to be coupled across the light emitting device for detecting the forward voltage of the light emitting device and the driving current, and configured to generate a second feedback voltage according to the forward voltage of the light emitting device and the driving current; and a pulse wave generating circuit coupled to the optical-type feedback circuit, the electrical-type feedback circuit and the current generating circuit, the pulse wave generating circuit being configured to generate the pulse-wave signal according to one of the first feedback voltage and the second feedback voltage, the duty cycle of the pulse-wave signal being inversely proportional to magnitude of the one of the first feedback voltage and the second feedback voltage.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 4:
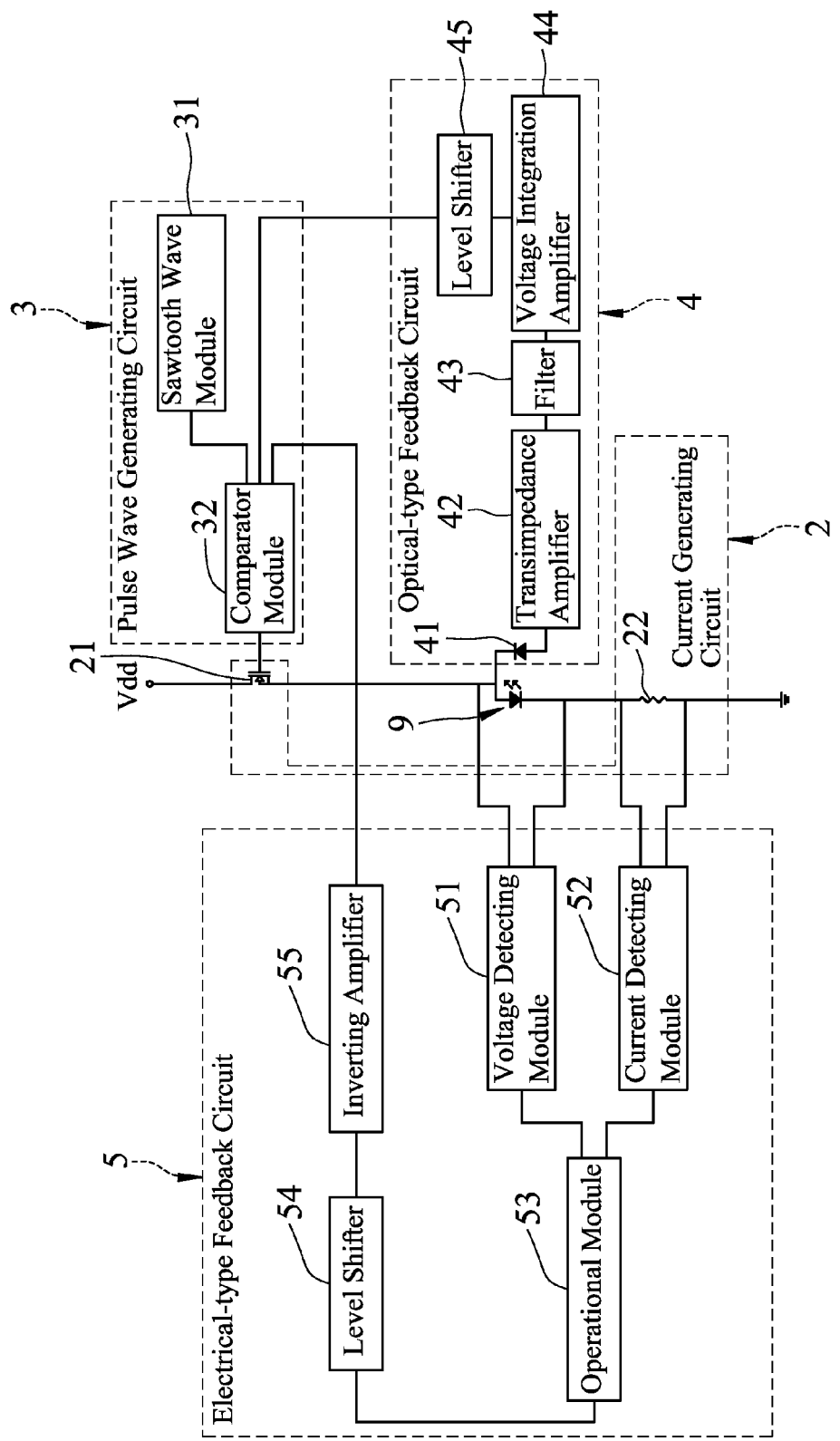
FIG. 4 is a block diagram illustrating a preferred embodiment of an optical power stabilizing device according to the present invention.

Referring to FIG. 4, the preferred embodiment of the optical power stabilizing device according to this invention is for stabilizing optical power of a light emitting device 9. In this embodiment, the light emitting device 9 is a laser diode, and has a forward voltage having an inverse relationship with an ambient temperature when driven with current. The optical power stabilizing device comprises a current generating circuit 2, a pulse wave generating circuit 3, an optical-type feedback circuit 4, and an electrical-type feedback circuit 5.

The current generating circuit 2, which is coupled to the light emitting device 9, receives and converts a pulse-wave signal into a driving current and a driving voltage each being a pulse wave in magnitude. The driving current is provided to the light emitting device 9 and has an average magnitude proportional to a duty cycle of the pulse-wave signal. In this embodiment, the current generating circuit 2 includes a switch 21 and a resistor 22.

The switch 21 is coupled between an anode of the light emitting device 9 and a first voltage source Vdd, and is controlled by the pulse-wave signal to make or break electrical connection so as to generate the driving current and the driving voltage.

The resistor 22 is coupled between a cathode of the light emitting device 9 and a second voltage source. In this embodiment, the second voltage source is a ground node, but is not limited thereto.

The optical-type feedback circuit 4 includes a photodetector 41 (e.g., a photodiode) that detects light emitted by the light emitting device 9, that generates a photocurrent associated with optical power of the light emitting device 9, and that has a cathode coupled to the switch 21 for receiving the driving voltage, and an anode. The optical-type feedback circuit 4 generates a first feedback voltage according to the photocurrent.

The electrical-type feedback circuit 5 is coupled across the light emitting device 9 for detecting the forward voltage and the driving current so as to generate a second feedback voltage.

Figure 5:
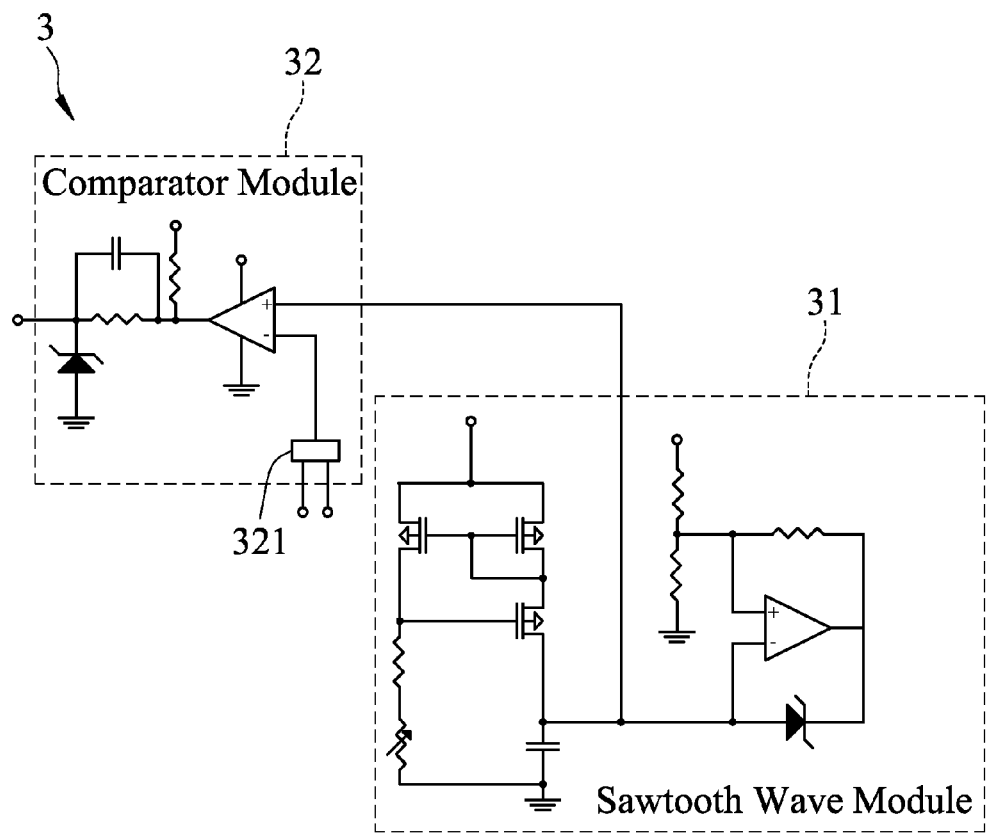
FIG. 5 is a schematic circuit diagram of a pulse wave generating circuit of the preferred embodiment.

Referring to FIGS. 4 and 5, the pulse wave generating circuit 3 is coupled to the current generating circuit 2, receives the first and second feedback voltages, and generates the pulse-wave signal according to at least one of the first and second feedback voltages. The duty cycle of the pulse-wave signal is inversely proportional to magnitude of the one of the first and second feedback voltages. In this embodiment, the pulse wave generating circuit 3 includes a sawtooth wave module 31 for generating a sawtooth voltage that ramps with a predetermined linear slope, and a comparator module 32.

The comparator module 32 receives the sawtooth voltage, and the first and second feedback voltages respectively from the sawtooth wave module 31, the optical-type feedback circuit 4 and the electrical-type feedback circuit 5, compares the sawtooth voltage and one of the first and second feedback voltages, and outputs the pulse-wave signal according to comparison between the sawtooth voltage and the one of the first and second feedback voltages.

Figure 6:
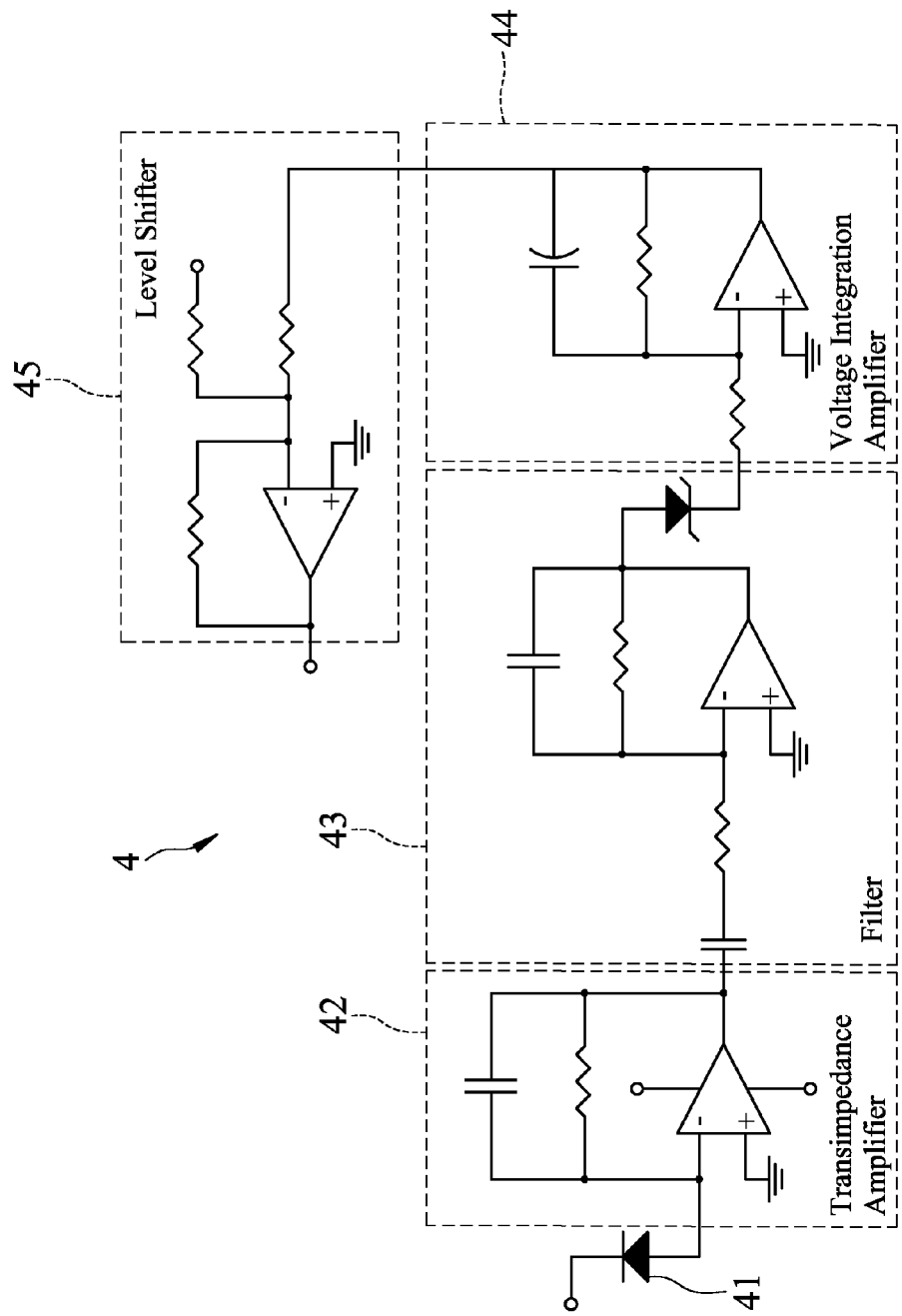
FIG. 6 is a schematic circuit diagram of an optical-type feedback circuit of the preferred embodiment.

Referring to FIGS. 4 and 6, the optical-type feedback circuit 4 further includes a transimpedance amplifier 42, a filter 43, a voltage integration amplifier 44 and a level shifter 45.

The transimpedance amplifier 42 is coupled to the anode of the photodetector 41 for receiving and converting the photocurrent into a pulse voltage output.

The filter 43 is coupled to the transimpedance amplifier 42 for receiving the pulse voltage output, and filters out noise from the pulse voltage output.

The voltage integration amplifier 44 is coupled to the filter 43 for receiving, integrating and amplifying the filtered pulse voltage output, and generates an integration voltage that is a direct current voltage.

The level shifter 45 is coupled to the voltage integration amplifier 44 for receiving the integration voltage, and shifts a voltage level of the integration voltage for obtaining the first feedback voltage. The level shifter 45 is configured according to a user-defined duty cycle of the pulse-wave signal to shift the voltage level. For example, when the light emitting device 9 is determined to emit light with a duty cycle of 20%, the level shifter 45 should be configured to have a target voltage level corresponding to the duty cycle of 20%, so that the optical-type feedback circuit 4 proceeds with feedback control based on the duty cycle of 20%. In this embodiment, the level shifter 45 is implemented using an adder, but may be implemented using a subtractor in other embodiments of this invention.

Figure 7:
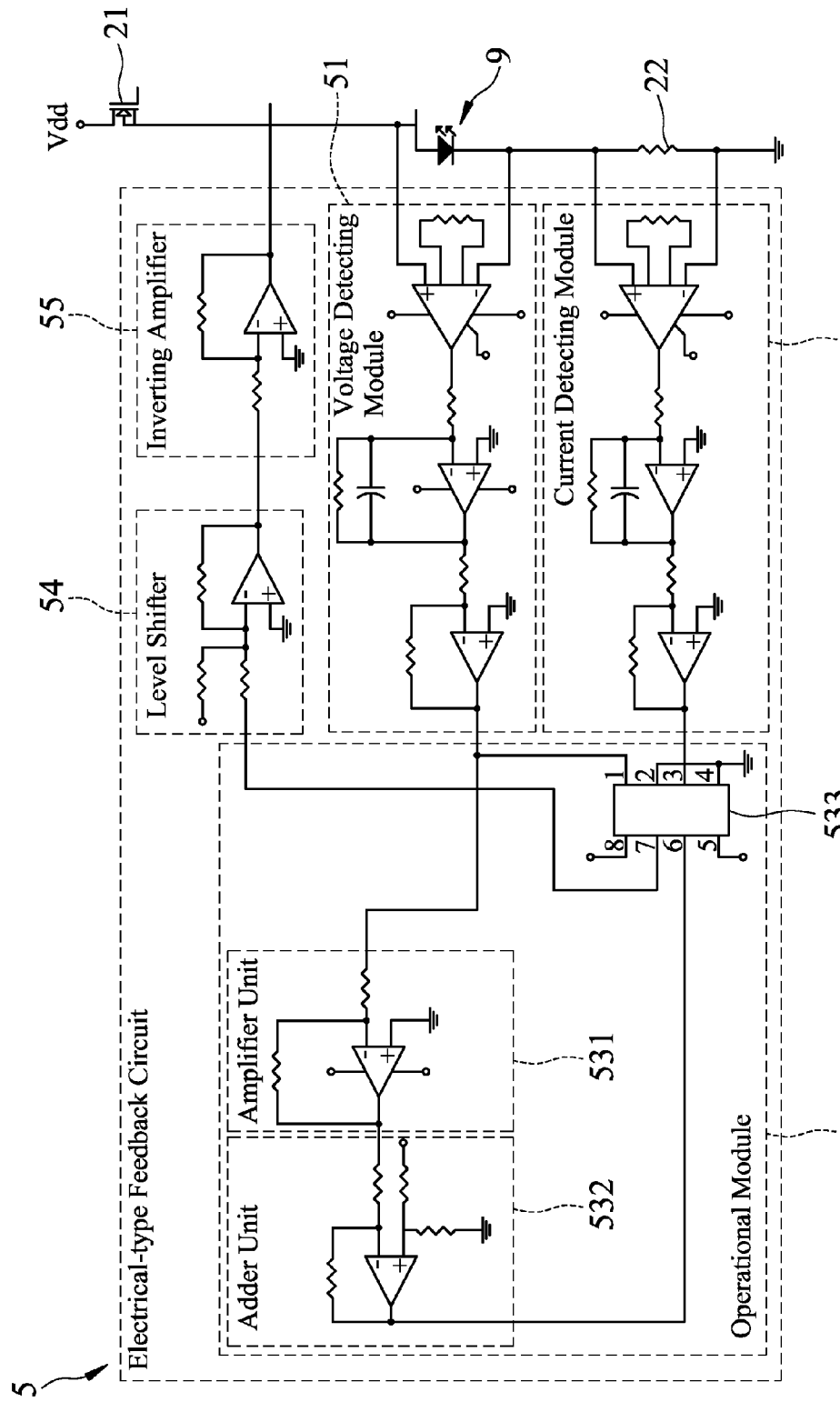
FIG. 7 is a schematic circuit diagram of an electrical-type feedback circuit of the preferred embodiment.

Referring to FIGS. 4 and 7, the electrical-type feedback circuit 5 includes a voltage detecting module 51, a current detecting module 52, an operational module 53, a level shifter 54 and an inverting amplifier 55.

The voltage detecting module 51 is coupled across the light emitting device 9 for detecting the forward voltage, and outputs a first detection voltage after integrating and amplifying the forward voltage detected thereby. In this embodiment, an instrumentation amplifier (AD620) is used to detect the forward voltage, but the invention is not limited thereto.

The current detecting module 52 is coupled across the resistor 22 for detecting a voltage thereacross as a result of the driving current flowing therethrough, and outputs a second detection voltage after integrating and amplifying the voltage detected thereby. In this embodiment, an instrumentation amplifier (AD620) is used to detect the voltage across the resistor 22, but the invention is not limited thereto.

The operational module 53 receives the first and second detection voltages, performs slope compensation on the first detection voltage so as to obtain a compensation voltage, performs multiplication operation between the first and second detection voltages, and adds the compensation voltage to a resulting product of the multiplication operation for obtaining an operation voltage.

In this embodiment, the operational module 53 includes an amplifier unit 531, a voltage adder unit 532 and a multiplier unit 533.

The amplifier unit 531 is coupled to the voltage detecting module 51 for receiving and amplifying the first detection voltage.

The voltage adder unit 532 is coupled to the amplifier unit 531 for receiving the amplified first detection voltage, and adds a predetermined voltage value to the amplified first detection voltage for obtaining the compensation voltage.

The amplifier unit 531 and the voltage adder unit 532 are used to perform the slope compensation on the first detection voltage according to an equation of y=ax+k, where y is the compensation voltage, x is the first detection voltage, and a and k are constants. In applications, values of a and k may vary due to different electro-optic conversion efficiencies among a variety of light emitting devices.

Figure 8:
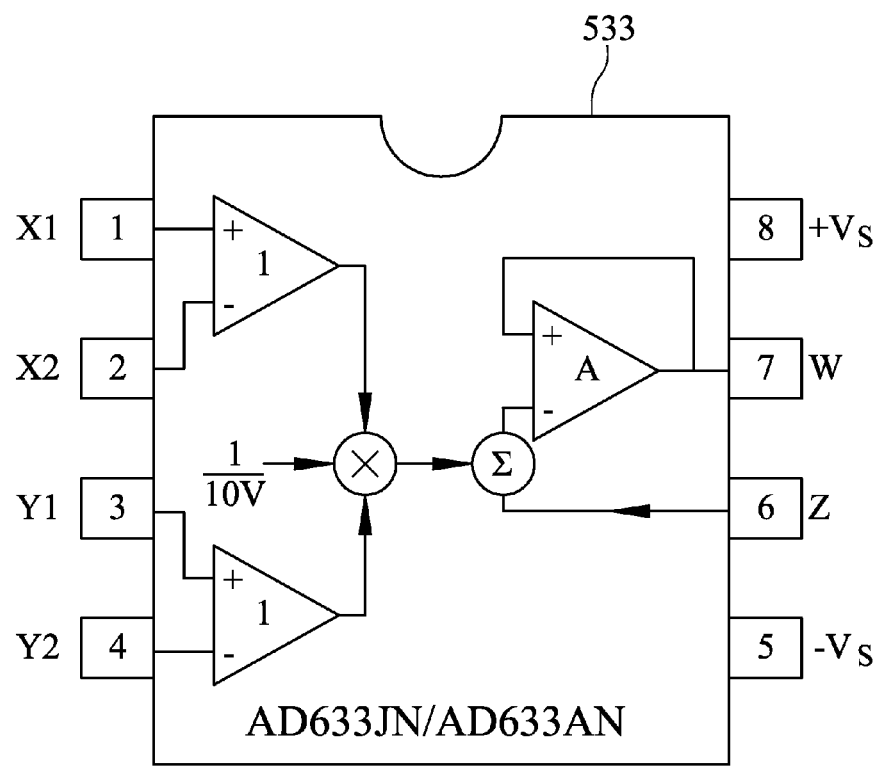
FIG. 8 is a schematic circuit diagram illustrating a commercially available multiplier unit.

The multiplier unit 533 is coupled to the voltage detecting module 51, the current detecting module 52, and the voltage adder unit 532 for receiving respectively the first detection voltage, the second detection voltage, and the compensation voltage, performs the multiplication operation, and adds the compensation voltage to the resulting product of the multiplication operation for obtaining the operation voltage. In this embodiment, the multiplier unit 533 may be implemented using a commercially available integrated circuit AD633JN or AD633AN (as shown in FIG. 8), and performs operation of $$W = \frac{(X1-X2)(Y1-Y2)}{10V} + Z,$$

where W is an output (the operation voltage), (X1−X2) is a first input, (Y1−Y2) is a second input, and Z is an addend (the compensation voltage). Referring to FIG. 7, in this embodiment, a terminal 2 of the multiplier unit 533 is grounded, so that the first detection voltage is the first input. Similarly, a terminal 4 of the multiplier unit 533 is grounded, so that the second detection voltage is the second input. Referring to FIG. 8, terminals 5, 8 of the multiplier unit 533 are power terminals of the chip, and are coupled respectively to power sources −Vs, +Vs. In other embodiments, the multipler unit 533 may be implemented using other appropriate chips without being particularly limited.

Referring to FIGS. 4 and 7, the level shifter 54 is coupled to the multiplier unit 533 for receiving the operation voltage, and shifts a voltage level of the operation voltage according to the user-defined duty cycle of the pulse-wave signal.

The inverting amplifier 55 is coupled to the level shifter 54 for receiving and inversely amplifying the level-shifted operation voltage, so as to obtain the second feedback voltage.

In this embodiment, since the level shifter 54 is implemented using an inverting adder, cooperation with the inverting amplifier 55 is required to invert the level-shifted operation voltage, and amplification of the inverting amplifier 55 may enhance sensitivity to the level-shifted operation voltage. In other embodiments, the level shifter 54 may cooperate with merely an inverter according to the actual requirement without being particularly limited.

In general application, the user may select to use one, or at least one of the optical-type feedback circuit 4 and the electrical-type feedback circuit 5 to perform feedback control and optical power compensation using a switch component 321 (e.g., a jumper) of the comparator module 32, as shown in FIG. 5.

In the case of the optical-type feedback circuit 4 being selected, optical power of the light emitting device 9 drops when the ambient temperature rises, resulting in decrease of photocurrent, and thus a decreasing first feedback voltage.

Figure 9:
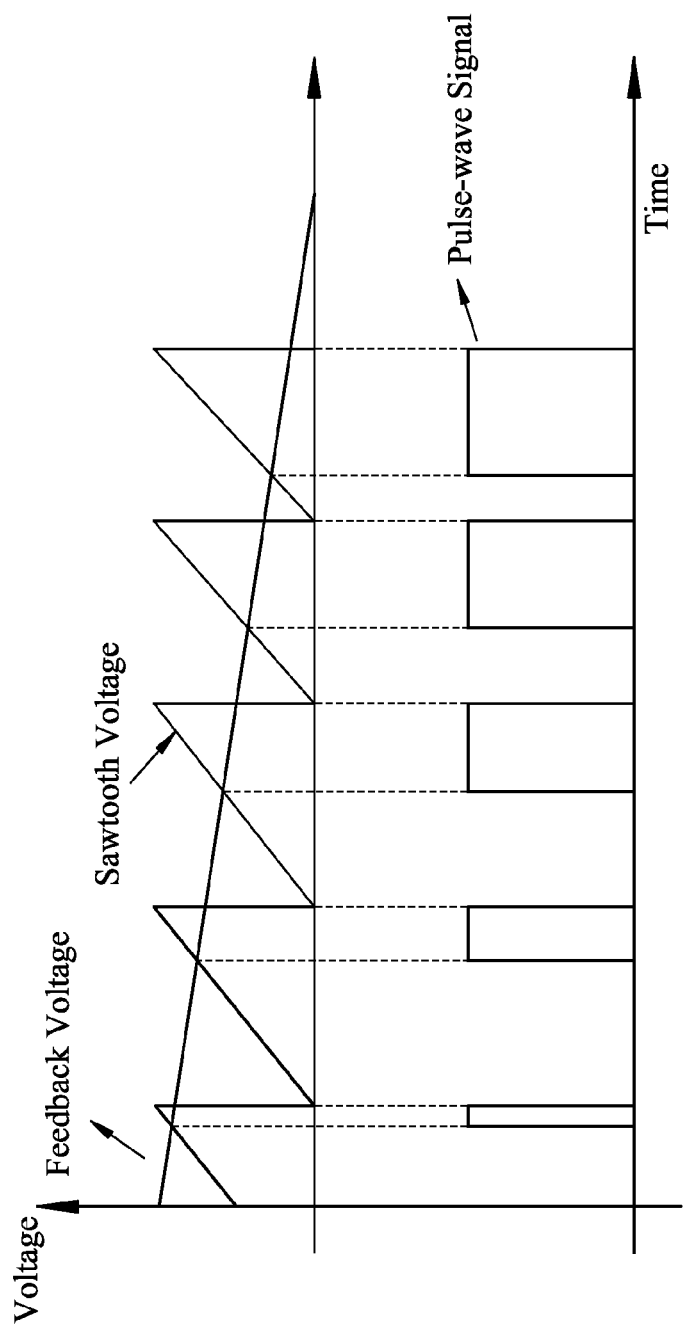
FIG. 9 is a plot illustrating generation of a pulse-wave signal by the pulse wave generating circuit of the preferred embodiment.

Referring to FIGS. 4 and 9, the comparator module 32 compares the sawtooth voltage and the decreasing first feedback voltage (as the feedback voltage shown in FIG. 9) for outputting the pulse-wave signal. The decreasing first feedback voltage leads to increase of the duty cycle of the pulse-wave signal, thus increasing average magnitude of the driving current, so as to compensate luminance and stabilize optical power of the light emitting device 9.

Similarly, when the photocurrent increases due to promotion of optical power of the light emitting device 9, the duty cycle of the pulse-wave signal decreases, resulting in smaller average magnitude of the driving current, and optical power of the light emitting device 9 is stabilized.

Figure 1:
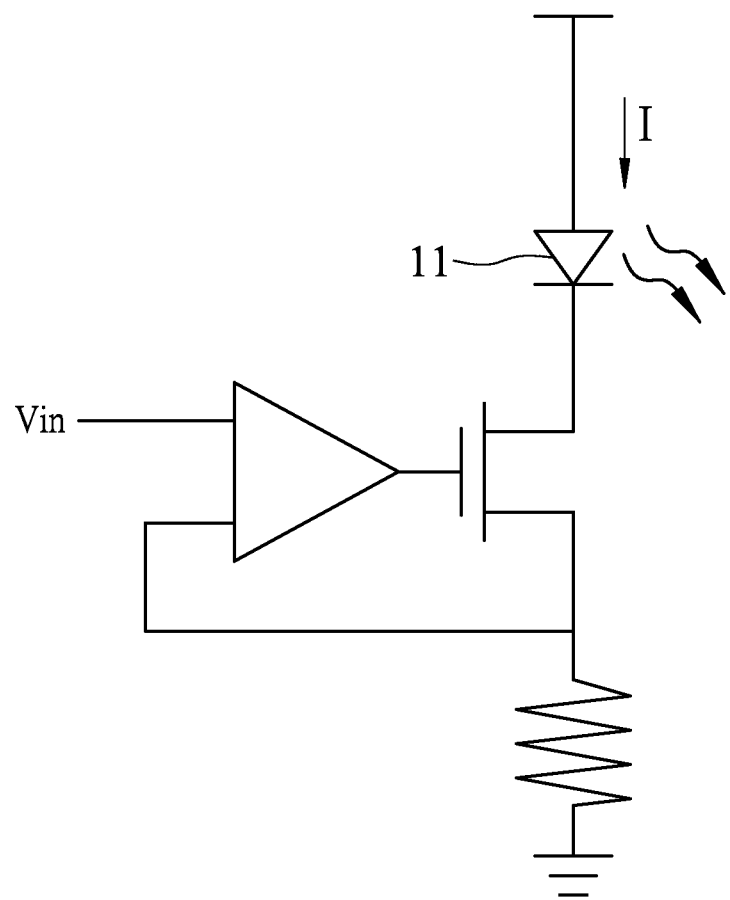
FIG. 1 is a schematic circuit diagram of a conventional optical power control device.
Figure 10:
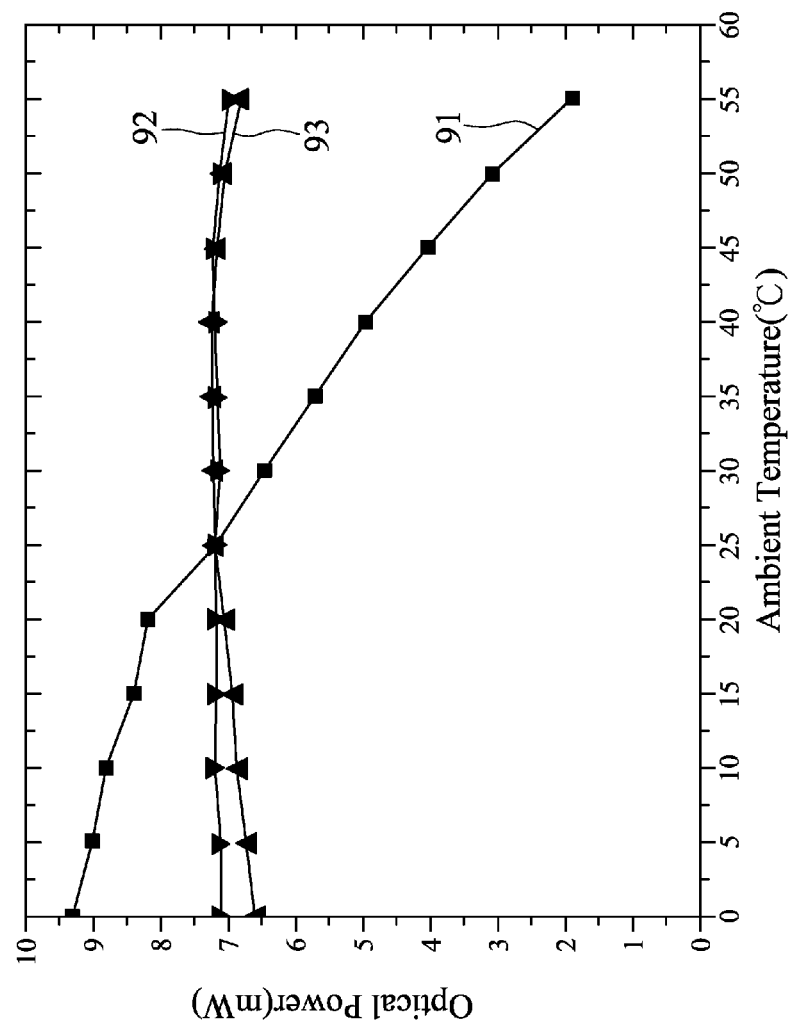
FIG. 10 is a plot comparing optical power-ambient temperature relationships of the conventional technique and the preferred embodiment.

Referring to FIG. 10, the curve 91 shows that optical power variation of the light emitting device 9 within the selected ambient temperature range is 72.14% when using the conventional technique (see FIG. 1), and the curve 92 shows that the same is 3.00% when using the preferred embodiment with the optical-type feedback circuit 4 being selected. It is evident that the optical-type feedback circuit 4 may significantly reduce optical power variation with the ambient temperature variation compared to the conventional technique. In the market, the laser diode is usually packaged with a photodiode, so that the co-packaged photodiode may be used with the laser diode to implement the preferred embodiment.

Figure 2:
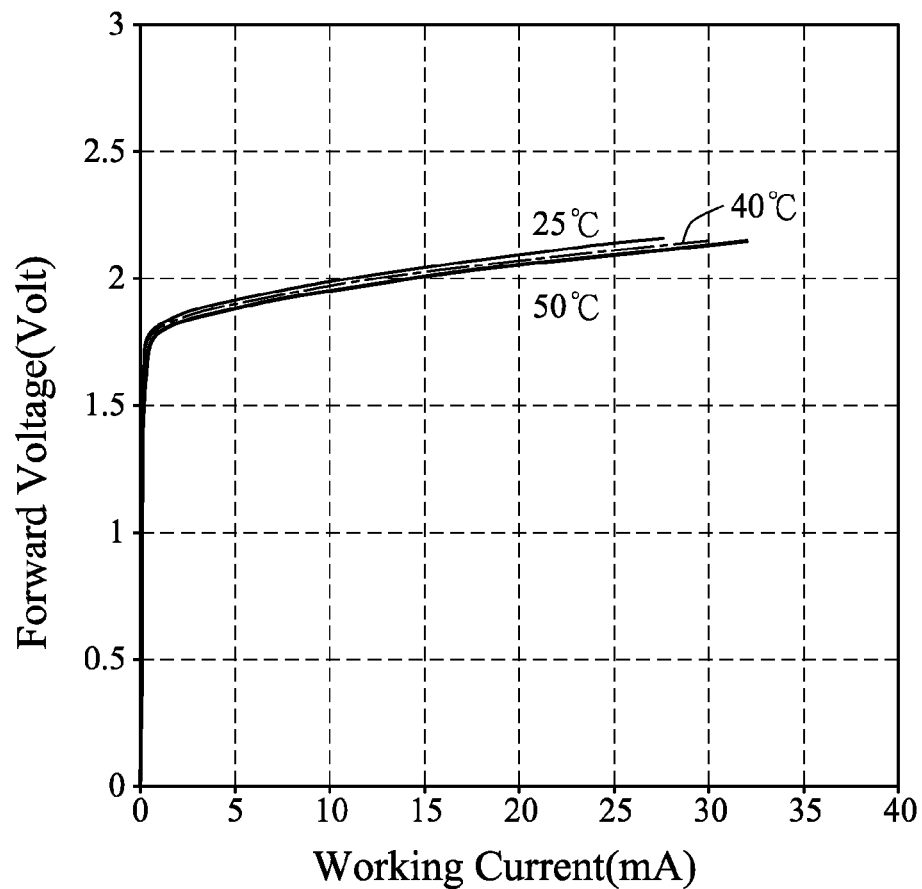
FIG. 2 is a plot illustrating relationships between a forward voltage and a working current of a laser diode under different ambient temperatures.
Figure 3:
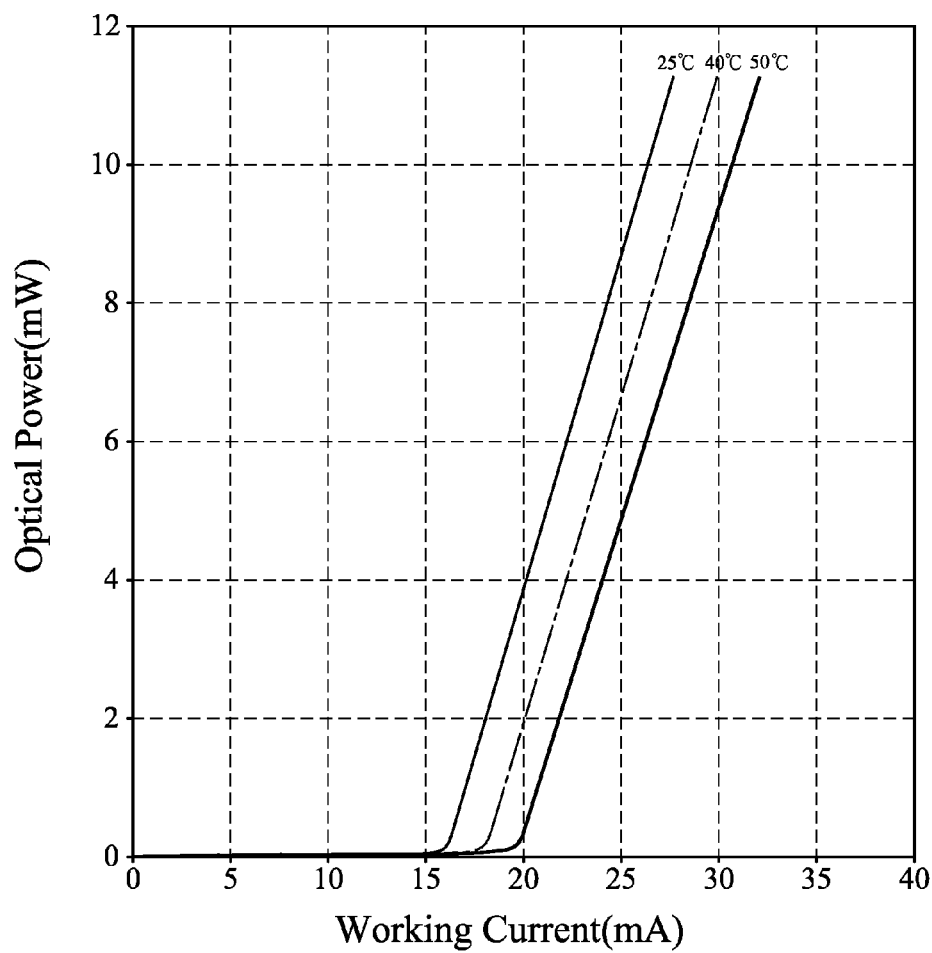
FIG. 3 is a plot illustrating relationships between optical power and the working current of the laser diode under different ambient temperatures.

In the case of the electrical-type feedback circuit 5 being selected, optical power and the forward voltage of the light emitting device 9 both drop (see FIGS. 2 and 3) when the ambient temperature rises, and the forward voltage and the driving current are detected respectively by the voltage detecting module 51 and the current detecting module 52, resulting in a decreasing second feedback voltage.

Referring to FIGS. 4 and 9, the comparator module 32 compares the sawtooth voltage and the decreasing second feedback voltage (as the feedback voltage shown in FIG. 9) for outputting the pulse-wave signal. The decreasing second feedback voltage leads to increase of the duty cycle of the pulse-wave signal, thus increasing average magnitude of the driving current, so as to compensate luminance and stabilize optical power of the light emitting device 9.

It should be noted that, since the forward voltage varies with the ambient temperature, ambient temperature variation is included in the feedback computation.

Similarly, when the forward voltage increases due to promotion of optical power of the light emitting device 9, the duty cycle of the pulse-wave signal decreases, resulting in smaller average magnitude of the driving current, and optical power of the light emitting device 9 is stabilized.

Referring to FIG. 10, curve 93 shows that optical power variation of the light emitting device 9 within the selected ambient temperature range is 9.03% when using the preferred embodiment with the electrical-type feedback circuit 5 being selected. It is evident that the electrical-type feedback circuit 4 may significantly reduce optical power variation with the ambient temperature variation compared to the conventional technique.

It should be noted that, with rise in the ambient temperature, although reduction of the forward voltage is associated with reduction of the optical power of the light emitting device 9, there are differences existing therebetween. If the forward voltage is directly used as the second feedback voltage for adjusting the duty cycle of the pulse-wave signal, although the electric power (product of the forward voltage and the driving current) of the light emitting device 9 may be non-varying with the ambient temperature, the optical power (measured by instrument) thereof may still vary with the ambient temperature. In detail, the electrical power $P=I \times V$, and the optical power $L=P \times N(t)$, where I is the driving current, V is the forward voltage, and $N(t)$ is the electro-optic conversion efficiency of the light emitting device 9. It is known from the equations that even if the electrical power P is non-varying with the ambient temperature, the optical power L may vary with the ambient temperature since the electro-optic conversion efficiency varies with the ambient temperature t. Generally, $N(t)$ is reduced with rise in the ambient temperature. Accordingly, the operational module 53 of the preferred embodiment computes the electrical power and performs the slope compensation, so as to compensate the temperature effect resulting from the electro-optic conversion efficiency $N(t)$, and to make the optical power L non-varying with the ambient temperature.

Figure 11:
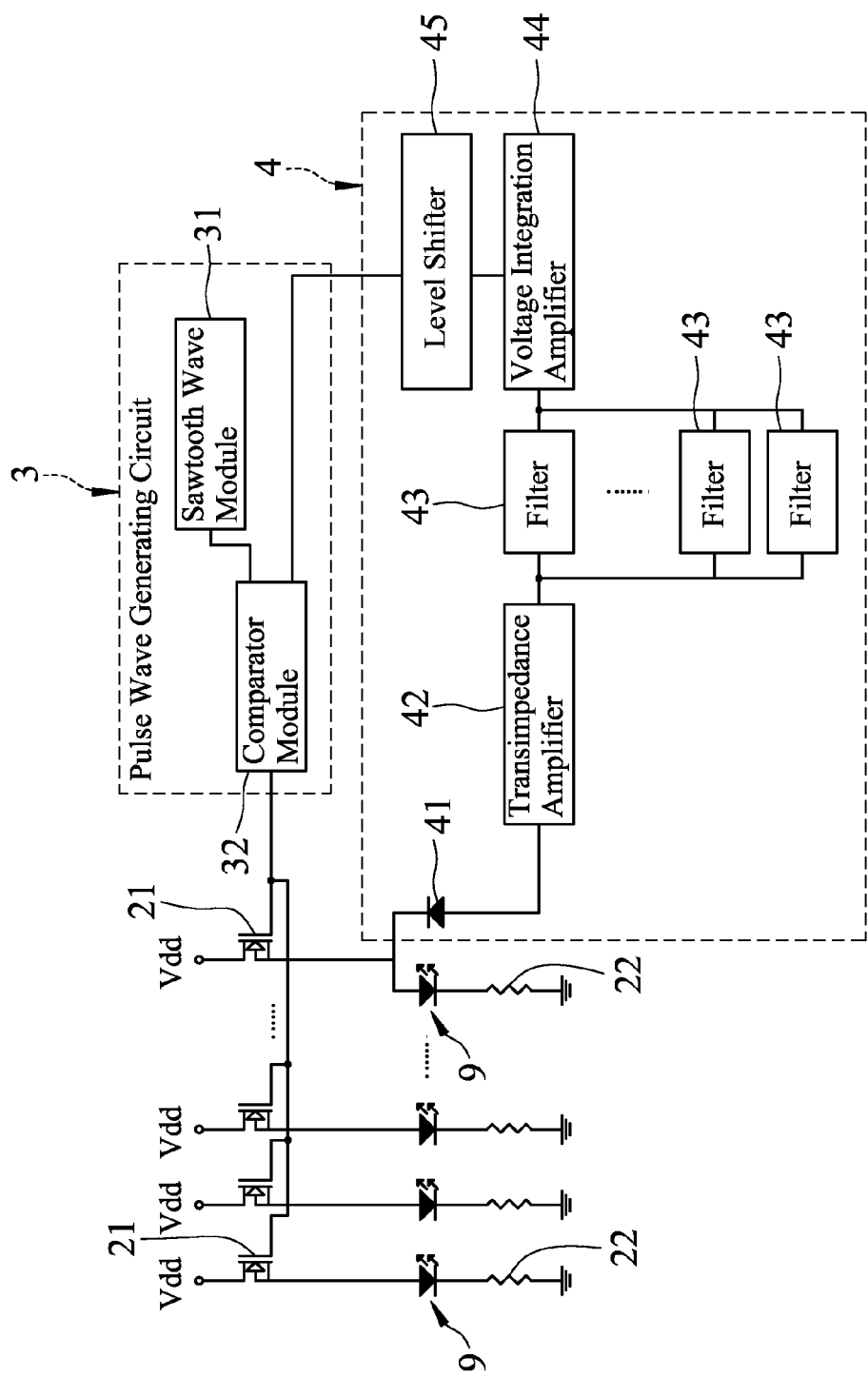
FIG. 11 is a schematic circuit diagram of an application of the preferred embodiment.

Referring to FIG. 11, the preferred embodiment may be applied to multiple light emitting devices 9, and only part of the circuit is shown for the sake of clarity.

As shown in FIG. 11, each of the light emitting devices 9 is provided with a switch 21 and a resistor 22, and is coupled to the comparator module 32. When the switches 21 are controlled using different frequencies, the light emitting devices 9 may have different light emitting frequencies. In such a case, optical power detection may be performed using only one photodetector 41 with multiple filters 43 each being configured in correspondence with one of the light emitting devices 9 for obtaining a corresponding filtered pulse voltage output, followed by the abovementioned optical power control process.

Therefore, the preferred embodiment has the following advantages:

1. The light emitting device 9 is driven by the driving current in a pulse-wave manner, which allows light emission in an active duration and heat dissipation in an inactive duration, resulting in a relatively small temperature increment. For example, when the duty cycle is 0.1, the light emitting device 9 emits light for one-tenth of a cycle time, and dissipates heat for the other nine-tenths of the cycle time.

2. By virtue of the optical-type feedback circuit 4 and the electrical-type feedback circuit 5, the optical power of the light emitting device 9 is stabilized to be non-varying with the ambient temperature. In addition, it is convenient for users to select between the optical-type feedback circuit 4 and the electrical-type feedback circuit 5 as required.

3. The preferred embodiment may be applied to multiple light emitting devices 9 by use of different frequencies of the pulse-wave signal.

To sum up, the present invention may not only alleviate temperature variation of the light emitting device 9 during operation, but also stabilize optical power of the light emitting device 9 to be non-varying with the ambient temperature.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An optical power stabilizing device adapted to stabilize optical power of alight emitting device that has a forward voltage, the forward voltage having an inverse relationship with an ambient temperature when driven with current, said optical power stabilizing device comprising:
   a current generating circuit to be coupled to the light emitting device and disposed to receive a pulse-wave signal, said current generating circuit being configured to convert the pulse-wave signal into a driving current to be provided to the light emitting device, the driving current being a pulse wave in magnitude and having an average magnitude proportional to a duty cycle of the pulse-wave signal;
   an optical-type feedback circuit including a photodetector that is disposed to detect light emitted by the light emitting device, and that is configured to generate a photocurrent associated with optical power of the light emitting device, said optical-type feedback circuit being configured to generate a first feedback voltage according to the photocurrent;
   an electrical-type feedback circuit to be coupled across the light emitting device for detecting the forward voltage of the light emitting device and the driving current, and configured to generate a second feedback voltage according to the forward voltage of the light emitting device and the driving current; and
   a pulse wave generating circuit coupled to said optical-type feedback circuit, said electrical-type feedback circuit and said current generating circuit, said pulse wave generating circuit being configured to generate the pulse-wave signal according to one of the first feedback voltage and the second feedback voltage, the duty cycle of the pulse-wave signal being inversely proportional to magnitude of said one of the first feedback voltage and the second feedback voltage.

2. The optical power stabilizing device as claimed in claim 1, wherein said current generating circuit includes a switch and a resistor that are to be coupled to the light emitting device in series, a circuit connection formed by said switch, the light emitting device, and said resistor being disposed to be coupled between a first voltage source and a second voltage source, wherein said switch is controlled by the pulse-wave signal to make or break electrical connection so as to generate the driving current flowing through the light emitting device and said resistor.

3. The optical power stabilizing device as claimed in claim 2, wherein said electrical-type feedback circuit includes:
   a voltage detecting module to be coupled across the light emitting device for detecting the forward voltage thereof, and outputting a first detection voltage;
   a current detecting module coupled across said resistor of said current generating circuit, and outputting a second detection voltage according to the driving current;
   an operational module coupled to said voltage detecting module and said current detecting module for receiving respectively the first detection voltage and the second detection voltage therefrom, and configured to perform multiplication operation between the first detection voltage and the second detection voltage, and to output an operation voltage according to a resulting product of the multiplication operation; and
   a level shifter coupled to said operational module for receiving the operation voltage, and configured to shift a voltage level of the operation voltage, the second feedback voltage being obtained from the operation voltage after level shifting.

4. The optical power stabilizing device as claimed in claim 3, wherein said operational module is further configured to perform slope compensation on the first detection voltage so as to obtain a compensation voltage, and to add the compensation voltage to the resulting product of the multiplication operation for obtaining the operation voltage.

5. The optical power stabilizing device as claimed in claim 4, wherein said operational module includes:
   an amplifier unit coupled to said voltage detecting module for receiving and amplifying the first detection voltage;
   a voltage adder unit coupled to said amplifier unit for receiving the first detection voltage amplified by said amplifier unit, and configured to add a predetermined voltage value to the first detection voltage amplified by said amplifier unit for obtaining the compensation voltage; and
   a multiplier unit coupled to said voltage detecting module, said current detecting module, and said voltage adder unit for receiving respectively the first detection voltage, the second detection voltage, and the compensation voltage, and configured to perform the multiplication operation, and to add the compensation voltage to the resulting product of the multiplication operation for obtaining the operation voltage.

6. The optical power stabilizing device as claimed in claim 3, wherein said level shifter is an inverting adder, said electrical-type feedback circuit further including an inverting amplifier coupled to said level shifter for receiving and inversely amplifying the operation voltage processed by said level shifter, so as to obtain the second feedback voltage.

7. The optical power stabilizing device as claimed in claim 2, wherein said switch of said current generating circuit is controlled by the pulse-wave signal to make or break electrical connection so as to further generate a driving voltage, the driving voltage being a pulse wave, said photodetector of said optical-type feedback circuit being a photodiode that has a cathode coupled to said switch for receiving the driving voltage, and an anode; and
   wherein said optical-type feedback circuit further includes:
   a transimpedance amplifier coupled to said anode of said photodetector for receiving the photocurrent, and configured to convert the photocurrent into a pulse voltage output;
   a filter coupled to said transimpedance amplifier for receiving the pulse voltage output, and configured to filter out noise from the pulse voltage output;
   a voltage integration amplifier coupled to said filter for receiving the pulse voltage output processed by said filter, and configured to integrate and amplify the pulse voltage output for generating an integration voltage that is a direct current voltage; and
   a level shifter coupled to said voltage integration amplifier for receiving the integration voltage, and configured to shift a voltage level of the integration voltage for obtaining the first feedback voltage.

8. The optical power stabilizing device as claimed in claim 1, wherein said pulse wave generating circuit includes:

a sawtooth wave module for generating a sawtooth voltage that ramps with a predetermined linear slope; and a comparator module coupled to said sawtooth wave module for receiving the sawtooth voltage, coupled to said optical-type feedback circuit and said electrical-type feedback circuit, and configured to compare the sawtooth voltage and one of the first feedback voltage and the second feedback voltage, and to output the pulse-wave signal according to comparison between the sawtooth voltage and said one of the first feedback voltage and the second feedback voltage.

* * * * *